United States Patent
Hashimoto et al.

(10) Patent No.: US 6,911,125 B2
(45) Date of Patent: Jun. 28, 2005

(54) THIN FILM PRODUCING METHOD AND LIGHT BULB HAVING SUCH THIN FILM

(75) Inventors: Naotaka Hashimoto, Takatsuki (JP); Yuuji Omata, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/344,298

(22) PCT Filed: Sep. 4, 2001

(86) PCT No.: PCT/JP01/07666

§ 371 (c)(1),
(2), (4) Date: Feb. 7, 2003

(87) PCT Pub. No.: WO02/21572

PCT Pub. Date: Mar. 14, 2002

(65) Prior Publication Data

US 2003/0183512 A1 Oct. 2, 2003

(30) Foreign Application Priority Data

Sep. 7, 2000 (JP) ........................ 2000-272189

(51) Int. Cl.⁷ ............................................. C23C 14/34
(52) U.S. Cl. ......................... 204/192.26; 204/192.12; 204/192.27; 204/192.28; 204/192.16
(58) Field of Search ...................... 204/192.12, 192.16, 204/192.26, 192.27, 192.28

(56) References Cited

U.S. PATENT DOCUMENTS

| | | | |
|---|---|---|---|
| 4,999,096 A | 3/1991 | Nihei et al. ............... | 201/192.3 |
| 5,962,959 A | * 10/1999 | Iwasaki et al. ............. | 313/310 |
| 6,472,022 B1 | * 10/2002 | Omata et al. ............... | 427/424 |

FOREIGN PATENT DOCUMENTS

| | | | |
|---|---|---|---|
| EP | 0 691 419 | 1/1996 | ........... C23C/14/35 |
| JP | 59-169054 | 9/1984 | ........... H01K/1/32 |
| JP | 9-118544 | 5/1997 | ........... C03C/17/34 |
| JP | 10-55786 | 2/1998 | ........... H01K/1/32 |
| JP | 11-213959 | 8/1999 | ........... H01K/1/32 |
| JP | 2001-102006 | 4/2001 | ........... H01K/1/32 |
| JP | 2001-256925 | 9/2001 | ........... H01J/65/00 |

OTHER PUBLICATIONS

English translation of JP 9-118544 A.*

Brett, J., et al., "Radiation–conserving incandescent lamps", *Journal of Illuminating Engineering Society*, Jul. 1980, pp 197–203.

* cited by examiner

Primary Examiner—Steven VerSteeg
(74) Attorney, Agent, or Firm—Merchant & Gould P.C.

(57) ABSTRACT

When forming an optical thin film on a surface of a bulb of a light source such as an electric lamp or a discharge lamp, a thin film whose interface/surface is less rough is formed on a base having a spheroid shape. When forming a thin film on a base 2 with a spheroid shape, which is disposed in a vacuum chamber 4 of a film-forming device and spun on its rotation axis, an interface or a surface of the thin film is made less rough and the thickness distribution of the thin film is made smaller by setting a sputtering gas pressure to be in a range from 0.04 Pa to 5.0 Pa; by using, as a sputtering gas, a mixed gas of Ar gas and $N_2$ gas in which the $N_2$ gas is present at a partial pressure ratio of 1 to 6 assuming a partial pressure of the Ar gas is 100, or a mixed gas of Ar gas, $N_2$ gas, and $O_2$ gas in which the $N_2$ gas is present at a partial pressure ratio of 1 to 6 and $O_2$ gas is present at a partial pressure ratio of 6 or less assuming a partial pressure of the Ar gas is 100; by setting an input power applied at the start of thin film formation to be the greatest throughout a sputtering process; or by applying a negative bias to the base.

13 Claims, 2 Drawing Sheets

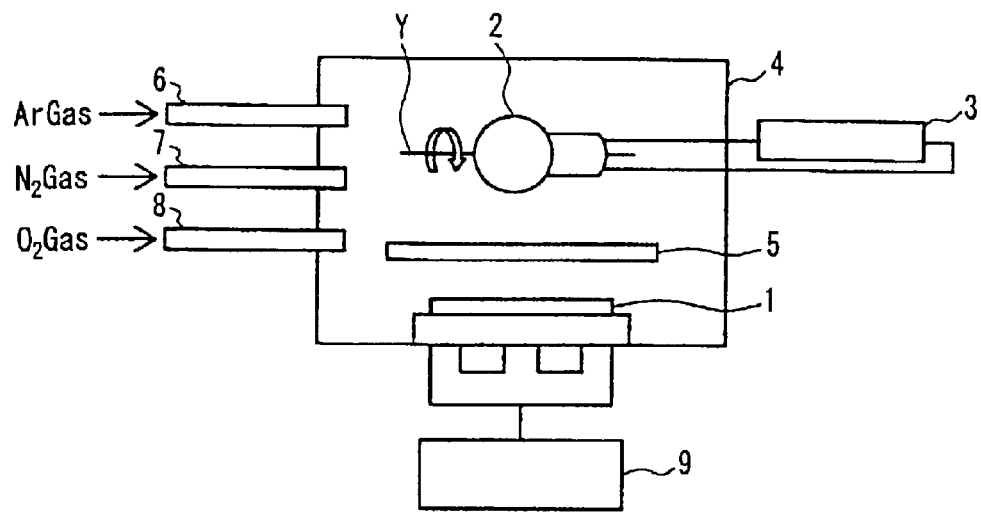
F I G. 1
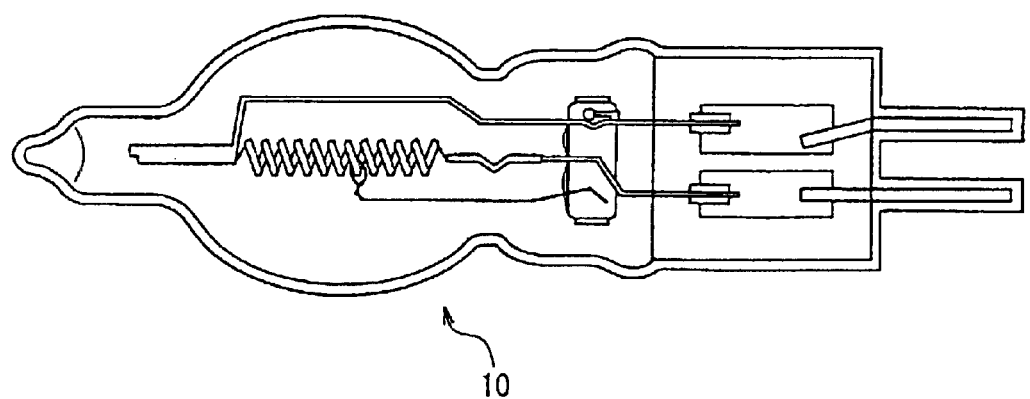
F I G. 2

THIN FILM PRODUCING METHOD AND LIGHT BULB HAVING SUCH THIN FILM

TECHNICAL FIELD

The present invention relates to a method for forming an optical thin film on a surface of a bulb of a light source such as an electric lamp or a discharge lamp and to an electric lamp having this thin film.

BACKGROUND ART

As a method for enabling efficient use of the power consumed in an electric lamp such as an incandescent lamp and a tungsten halogen lamp, there has been proposed providing an infrared reflection film on a surface of a bulb of the electric lamp so that infrared light, which accounts for 70% to 80% of the radiant energy, is selectively reflected by the infrared reflection film and converged on a filament portion of the electric lamp to heat the filament coil while visible light emitted from the lamp is transmitted through the bulb (e.g., *Journal of Illuminating Engineering Society*, pp.197–203, July 1980).

A practical-level electric lamp consuming 20% to 30% less power as compared with an electric lamp providing the same intensity of illumination (total luminous flux) has been realized by allowing the filament coil of the electric lamp to be reheated by the infrared light that is selectively reflected by the infrared reflection film and effectively converged on the filament coil after being emitted from the filament coil owing to a suitable shape of the bulb.

A general method for forming such an infrared reflection film includes sputtering, various evaporation methods, etc. For the purpose of reducing the ratio of the infrared light escaping from the bulb as heat rays and/or transmitting only visible light selectively while reflecting as much infrared light as possible effectively, an optical-film-forming technique for forming, as a visible/infrared filter, an interference multilayer film having a laminated structure including at least one transparent dielectric thin film having a high refractive index and at least one transparent dielectric thin film having a low refractive index has been used. In this case, the difference between the actual thickness and the desired thickness of the respective optical thin films, which are formed on the bulb typically having a three-dimensional spheroid shape, needs to be sufficiently small, and also, the thickness distribution of the respective optical thin films needs to be sufficiently small so that the resultant optical filter has a wavelength selectivity.

In the interference multilayer film as described above, not only the precise thickness of the respective optical thin films but also materials used for the respective optical films are important for efficient infrared reflection. When the interference multilayer film is formed by sputtering under the general film-forming condition, i.e., by using either Ar gas or a mixed gas of Ar gas and $O_2$ gas as a sputtering gas, there arises a problem that an interface or a surface of a resultant thin film becomes rough so that infrared light cannot be reflected sufficiently effectively. More specifically, infrared light is diffused by the rough interface or surface of the interference multilayer film when reflected, thereby preventing the infrared light from being converged on the firmament coil effectively, resulting in the reduced infrared-reflection efficiency. On the other hand, while a CVD method allows a thin film whose interface or surface is less rough to be obtained easily, it has many problems such that the absolute value of the thickness of a resultant thin film is not always controlled sufficiently; a base on which a thin film is to be formed needs to be heated; and, when forming a multilayer film including different types of thin films, different gases and film-forming conditions need to be used depending on the types of the thin films.

The preset invention aims to solve the above-mentioned problems. It is an object of the present invention to provide a method for forming a thin film whose interface or surface is less rough on a base including a spheroid shape by sputtering and to provide an electric lamp provided with this thin film.

DISCLOSURE OF INVENTION

In order to achieve the above-mentioned object, the first method for forming a thin film according to the present invention includes performing sputtering while spinning the base on a spheroid axis, wherein a gas pressure is in a range from 0.04 Pa to 5.0 Pa.

The second method of the present invention is a method for forming a thin film on a base including a spheroid shape, wherein a mixed gas of Ar gas and $N_2$ gas in which the $N_2$ gas is present at a partial pressure ratio of 1 to 6 assuming a partial pressure of the Ar gas is 100, or a mixed gas of Ar gas, $N_2$ gas, and $O_2$ gas in which the $N_2$ gas is present at a partial pressure ratio of 1 to 6 and $O_2$ gas is present at a partial pressure ratio of 6 or less assuming a partial pressure of the Ar gas is 100, is used as a sputtering gas while the base is being spun on a spheroid axis.

The third method of the present invention is a method for forming a thin film on a base including a spheroid shape, wherein an input power applied at a start of thin film formation is the greatest throughout a sputtering process, the sputtering process being performed while spinning the base on a spheroid axis.

The fourth method of the present invention is a method for forming a thin film on a base including a spheroid shape, which includes applying a negative bias to the base while spinning the base on a spheroid axis.

In the above-mentioned first to fourth methods, it is preferable that the base is a bulb of an electric lamp selected from tungsten halogen lamps and incandescent lamps.

Further, in the above-mentioned methods, it is preferable that the sputtering is radio frequency-sputtering.

Furthermore, in the above-mentioned methods, it is preferable that $Ta_2O_5$ and $SiO_2$ are used as materials for forming a thin film.

Next, an electric lamp according to the present invention includes an infrared reflection film having a surface roughness Ra ranging from 2.9 nm to 20.0 nm.

Further, in the above-mentioned electric lamp, it is preferable that the infrared reflection film is formed by sputtering.

BRIEF DESCRIPTION OF DRAWINGS

FIG. 1 is a view illustrating a method for forming a thin film according to one example of the present invention.

FIG. 2 is a front view showing a configuration of a bulb of an electric lamp according to one example of the present invention.

BEST MODE FOR CARRYING OUT THE INVENTION

Figure 3:
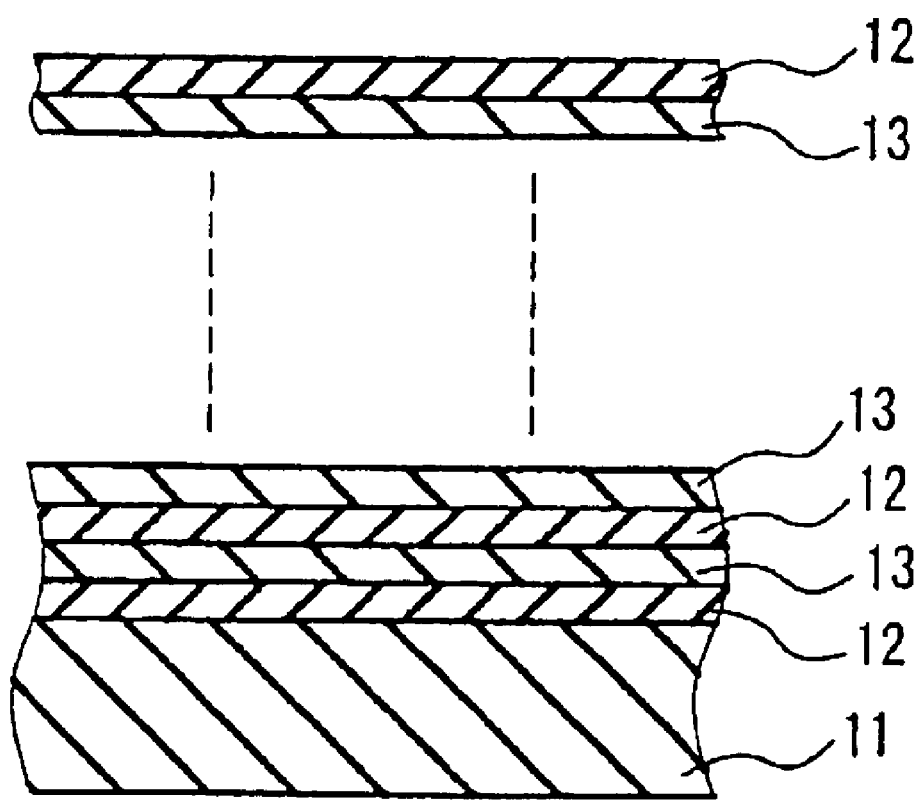
FIG. 3 is a cross-sectional view showing a configuration of a thin film according to one example of the present invention.

According to one example of the present invention, an interface or a surface of a thin film formed on a base including a spheroid shape can be made less rough and the thickness distribution of the thin film also can be made smaller by setting a sputtering gas pressure to be in a range from 0.04 Pa to 5.0 Pa; by using, as a sputtering gas, a mixed gas of Ar gas and $N_2$ gas in which the $N_2$ gas is present at a partial pressure ratio of 1 to 6 assuming a partial pressure of the Ar gas is 100, or a mixed gas of Ar gas, $N_2$ gas, and $O_2$ gas in which the $N_2$ gas is present at a partial pressure ratio of 1 to 6 and $O_2$ gas is present at a partial pressure ratio of 6 or less assuming a partial pressure of the Ar gas is 100; by setting an input power applied at the start of thin film formation to be the greatest throughout a sputtering process; or by applying a negative bias to the base.

Hereinafter, the present invention will be described in detail by way of specific examples. FIG. 1 shows a radio frequency-sputtering apparatus used in the following respective embodiments. This film-forming apparatus is provided with a radio frequency power supply 9. Inside a vacuum chamber 4 of this apparatus, a base 2 having a spheroid shape opposes a sputtering target 1 (film-forming source) of 8 inch×36 inch with a shutter 5 intervening therebetween. The apparatus is further provided with an inlet 6 for supplying Ar gas to the vacuum chamber 4, an inlet 7 for supplying $N_2$ gas chamber 4. Further, a direct-current power supply 3 is provided for applying a bias voltage to the base 2. During the film formation, the base 2 is spinning on the spheroid axis Y.

In the embodiments described below, a ratio of a gas mentioned is expressed as a ratio by volume.

(Embodiment 1)

In Embodiment 1, $Ta_2O_5$ thin films and $SiO_2$ thin films were formed on a surface of a bulb of an electric lamp so as to be laminated alternately by radio frequency-sputtering. In the present embodiment, the bulb was rotated on the spheroid axis Y at a constant angular velocity so as to prevent nonuniform thickness distribution of the respective thin films on the surface of the bulb. A mixed gas of Ar gas and $O_2$ gas was used as a sputtering gas when forming the $Ta_2O_5$ thin films while only Ar gas was used as a sputtering gas when forming $SiO_2$ thin films. The applied input power was 0 W at the start of thin film formation and was gradually increased so as to reach its maximum of 4000 W after 1 minute. The sputtering was performed at sputtering gas pressures of 0.03 Pa, 0.04 Pa, 0.15 Pa, 0.4 Pa, 1.0 Pa, 2.0 Pa, 3.0 Pa, 4.0 Pa, 5.0 Pa, and 6.0 Pa to form multilayer films (samples No.1 to No.9) each including eight thin films and having a thickness of about 1000 nm. The surface roughness Ra of the respective multilayer films was measured using an atomic force microscope (hereinafter, referred to as "AFM"). The results are shown in Table 1.

TABLE 1

Change in surface roughness Ra with sputtering gas pressure

| | sputtering gas (Pa) | surface roughness Ra (nm) |
|---|---|---|
| | 0.03 | film could not be formed (no discharge occurred) |
| multilayer film 1 | 0.04 | 7.7 |
| multilayer film 2 | 0.15 | 6.3 |
| multilayer film 3 | 0.4 | 4.8 |
| multilayer film 4 | 1.0 | 7.9 |
| multilayer film 5 | 2.0 | 13.8 |
| multilayer film 6 | 3.0 | 15.5 |
| multilayer film 7 | 4.0 | 16.6 |
| multilayer film 8 | 5.0 | 19.8 |
| multilayer film 9 | 6.0 | 22.1 |

(surface roughness of the base: 2.0 nm)

As can be seen from the results shown in Table 1, the multilayer film 3 formed at a sputtering gas pressure of 0.4 Pa has the smallest surface roughness Ra. When the surface roughness Ra is greater than 20.0 nm, infrared light is scattered considerably when it is reflected, resulting in a degraded infrared-reflection efficiency of the multilayer film as an infrared reflection film. Therefore, in the present embodiment, a multilayer film having a surface roughness of 20.0 nm or less is regarded as an effective multilayer film. Thus, it was confirmed that the multilayer films formed at a sputtering gas pressure of 0.04 to 5.0 Pa are effective multilayer films. The sputtering gas pressure is preferably in a range from 0.04 to 2.0 Pa and more preferably in a range from 0.04 to 1.0 Pa.

(Embodiment 2)

In Embodiment 2, $Ta_2O_5$ thin films and $SiO_2$ thin films were formed on a surface of a bulb of an electric lamp so as to be laminated alternately by radio frequency-sputtering as in Embodiment 1. Embodiment 2 differs from Embodiment 1 in that the sputtering was performed at a sputtering gas pressure of 0.4 Pa, a mixed gas of Ar gas, $N_2$ gas, and $O_2$ gas was used as a sputtering gas when forming the $Ta_2O_5$ thin films, and a mixed gas of Ar gas and $N_2$ gas was used as a sputtering gas when forming $SiO_2$ thin films. Multilayer films 10 to 13 each including eight thin films and having a thickness of about 1000 nm were formed under the above-mentioned conditions and the surface roughness Ra of the respective multilayer films was measured using AFM. The results are shown in Table 2 along with the data regarding the multilayer film 3 formed in Embodiment 1.

TABLE 2

Change in surface roughness Ra with type of sputtering gas

| | materials of thin film | type of sputtering gas (ratio) | surface roughness Ra (nm) |
|---|---|---|---|
| multilayer film 3 | $Ta_2O_5$ | $Ar/O_2$ (100/6) | 4.8 |
| | $SiO_2$ | Ar | |
| multilayer film 10 | $Ta_2O_5$ | $Ar/N_2/O_2$ (100/1/6) | 4.3 |
| | $SiO_2$ | $Ar/N_2$ (100/1) | |
| multilayer film 11 | $Ta_2O_5$ | $Ar/N_2/O_2$ (100/3/6) | 3.5 |
| | $SiO_2$ | $Ar/N_2$ (100/3) | |
| multilayer film 12 | $Ta_2O_5$ | $Ar/N_2/O_2$ (100/6/6) | 4.0 |
| | $SiO_2$ | $Ar/N_2$ (100/6) | |
| multilayer film 13 | $Ta_2O_5$ | $Ar/N_2/O_2$ (100/10/6) | 4.7 |
| | $SiO_2$ | $Ar/N_2$ (100/10) | |

(surface roughness of the base: 2.0 nm)

As can be seen from the results shown in Table 2, the multilayer film 11 formed using the mixed gas containing Ar gas, $N_2$ gas, and $O_2$ gas in which the Ar gas, $N_2$ gas, and $O_2$ gas are present at a ratio of 100:3:6 when forming the $Ta_2O_5$ thin films, and using the mixed gas of Ar gas and $N_2$ gas in which the Ar gas and $N_2$ gas are present at a ratio of 100:3 when forming the $SiO_2$ thin films, has the smallest surface roughness Ra. In the present embodiment, a multilayer film having a smaller surface roughness Ra than the multilayer film 3 formed using the sputtering gases containing no $N_2$ gas is regarded as an effective multilayer film. Thus, it was confirmed that the multilayer film formed using a mixed gas of Ar gas, $N_2$ gas, and $O_2$ gas in which 1 to 6 parts by volume of $N_2$ gas and 6 or less parts by volume of $O_2$ gas are present with respect to 100 parts by volume of Ar gas when forming the $Ta_2O_5$ thin films, and using a mixed gas of Ar gas and $N_2$ gas in which 1 to 6 parts by volume of $N_2$ gas are present with respect to 100 parts by volume of Ar gas when forming the $SiO_2$ thin films, are effective multilayer films.

(Embodiment 3)

In Embodiment 3, $Ta_2O_5$ thin films and $SiO_2$ thin films were formed on a surface of a bulb of an electric lamp so as to be laminated alternately by radio frequency-sputtering as in Embodiment 2. Embodiment 3 differs from Embodiment 2 in that the input power applied at the start of thin film formation was 4000 W. A multilayer film 14 including eight thin films and having a thickness of about 1000 nm was formed under the above-mentioned conditions and the surface roughness Ra of the multilayer film 14 was measured using AFM. The result is shown in Table 3 along with the data regarding the multilayer film 11 formed in Embodiment 2.

TABLE 3

Change in surface roughness Ra with input power at the start of thin film formation

|  | input power at the start of thin film formation (W) | surface roughness Ra (nm) |
|---|---|---|
| multilayer film 11 | 0 | 3.5 |
| multilayer film 14 | 4000 | 3.2 |

(surface roughness of the base: 2.0 nm)

As can be seen from the result shown in Table 3, the multilayer film 14 formed under the condition in which the electric power applied at the start of thin film formation was 4000 W has a smaller surface roughness Ra than the multilayer film formed under the condition in which the applied electric power was gradually made greater from the start of thin film formation.

(Embodiment 4)

In Embodiment 4, $Ta_2O_5$ thin films and $SiO_2$ thin films were formed on a surface of a bulb of an electric lamp so as to be laminated alternately by radio frequency-sputtering as in Embodiment 3. Embodiment 4 differs from Embodiment 3 in that a bias voltage of −20 V was applied to the bulb. A multilayer film 15 including eight thin films and having a thickness of about 1000 nm was formed under the above-mentioned conditions and the surface roughness Ra of the multilayer film 15 was measured using AFM. The result is shown in Table 4 along with the data regarding the multilayer film 14 formed in Embodiment 3.

TABLE 4

Change in surface roughness Ra with bias voltage applied to base

|  | bias voltage (V) | surface roughness Ra (nm) |
|---|---|---|
| multilayer film 14 | 0 | 3.2 |
| multilayer film 15 | −20 V | 2.9 |

(surface roughness of the base: 2.0 nm)

As can be seen from the result shown in Table 4, the multilayer film 15 formed under the condition in which a bias voltage of −20 V was applied to the bulb has a smaller surface roughness Ra than the multilayer film 14 formed without applying a bias voltage to the bulb.

FIG. 2 is a plan view showing the bulb 10 of the electric lamp used in the present embodiment. FIG. 3 is an enlarged cross-sectional view showing the multilayer film formed on the surface of the bulb (glass bulb) 10. In the present embodiment, $SiO_2$ thin films 12 and $Ta_2O_5$ thin films 13 are laminated alternately on the surface of the glass bulb 11. Either the $SiO_2$ thin film 12 or the $Ta_2O_5$ thin film 13 may be the outermost layer of the multilayer film.

According to the above-mentioned method, it is possible to provide an electric lamp having a thin film, i.e., an infrared reflection film, with a surface roughness Ra of 2.9 nm to 20.0 nm. When the surface roughness Ra is greater than 20.0 nm, infrared light is scattered considerably to degrade the infrared-reflection efficiency of the thin film. On the other hand, when the surface roughness Ra is smaller than 2.9 nm, the thin film is prone to be peeled off because adhesion between the thin film and the surface of the glass bulb becomes weaker. The surface roughness Ra is preferably in a range from 2.9 nm to 15 nm and more preferably in a range from 2.9 nm to 10 nm.

It is to be noted that the electric lamp is not limited to a specific type and includes all types of electric lamps using a filament as an illuminant, such as krypton lamps and tungsten halogen lamps.

Industrial Applicability

As specifically described above, the method for forming a thin film on a base having a spheroid shape according to the present invention can provide a thin film having a small surface roughness Ra. Therefore, the method of the present invention can improve the reflection efficiency of an infrared reflection film and thus can improve performance of the infrared reflection film.

Further, by setting the surface roughness Ra of an infrared reflection film to be in a range from 2.9 nm to 20.0 nm, an electric lamp of high performance with improved reflection efficiency can be obtained.

What is claimed is:

1. A method for forming a thin film on a base including a spheroid shape comprising:

performing sputtering while spinning the base on a spheroid axis; and applying a negative bias to the base while spinning the base on a spheroid axis, wherein the sputtering is radio frequency-sputtering, and wherein a gas pressure is in a range from 0.04 Pa to 5.0 Pa.

2. The method for forming a thin film according to claim 1, wherein an input power applied at a start of thin film formation is the greatest throughout a sputtering process, the sputtering process being performed while spinning the base on a spheroid axis.

3. The method for forming a thin film according to claim 2, wherein the base is a bulb of an electric lamp selected from tungsten halogen lamp and incandescent lamps.

4. The method for forming a thin film according to claim 1, wherein the base is a bulb of an electric lamp selected from tungsten halogen lamps and incandescent lamps.

5. The method for forming a thin film according to claim 1, wherein $Ta_2O_5$ and $SiO_2$ are used as materials for forming a thin film.

6. A method for forming a thin film on a base including a spheroid shape, wherein a mixed gas of Ar gas and $N_2$ gas in which the $N_2$ gas is present at a partial pressure ratio of 1 to 6 assuming a partial pressure of the Ar gas is 100, or a mixed gas of Ar gas, $N_2$ gas, and $O_2$ gas in which the $N_2$ gas is present at a partial pressure ratio of 1 to 6 and $O_2$ gas is present at a partial pressure ratio of 6 or less assuming a partial pressure of the Ar gas is 100, is used as a sputtering gas while the base is being spun on a spheroid axis, wherein the sputtering is radio frequency-sputtering.

7. The method for forming a thin film according to claim 6, wherein the base is a bulb of an electric lamp selected from tungsten halogen lamps and incandescent lamps.

8. The method for forming a thin film according to claim 6, wherein $Ta_2O_5$ and $SiO_2$ are used as materials for forming a thin film.

9. The method for forming a thin film according to claim 6, wherein
a $SiO_2$ thin film is formed using $SiO_2$ as a material and, as a sputtering gas, the mixed gas of Ar gas and $N_2$ gas is which the $N_2$ gas is present at the partial pressure ratio of 1 to 6 assuming the partial pressure of the Ar gas is 100, and
a $Ta_2O_5$ thin film is formed using $Ta_2O_5$ as a material and, as a sputtering gas, the mixed gas of Ar gas, $N_2$ gas, and $O_2$ gas in which the $N_2$ gas is present at the partial pressure ratio of 1 to 6 and $O_2$ gas is present at the partial pressure ratio of 6 or less assuming the partial pressure of the Ar gas is 100.

10. The method for forming a thin film according to claim 6,
wherein an input power applied at a start of thin film formation is the greatest throughout a sputtering process, the sputtering process being performed while spinning the base on a spheroid axis.

11. The method for forming a thin film according to claim 6, comprising:
applying a negative bias to the base while spinning the base on a spheroid axis.

12. A method for forming a thin film on a base including a spheroid shape comprising:
performing sputtering while spinning the base on a spheroid axis,
wherein the sputtering is radio frequency-sputtering,
wherein a gas pressure is in a range from 0.04 Pa to 5.0 Pa, and
wherein $Ta_2O_5$ and $SiO_2$ are used as materials for forming a thin film.

13. A method for forming a thin film on a base including a spheroid shape comprising:
performing sputtering while spinning the base on a spheroid axis,
wherein the sputtering is radio frequency-sputtering,
wherein a gas pressure is in a range from 0.04 Pa to 5.0 Pa,
wherein an input power applied at a start of thin film formation is the greatest throughout a sputtering process, the sputtering process being performed while spinning the base on a spheroid axis, and
wherein $Ta_2O_5$ and $SiO_2$ are used as materials for forming a thin film.

* * * * *